United States Patent
Redd et al.

(10) Patent No.: US 6,391,800 B1
(45) Date of Patent: May 21, 2002

(54) METHOD FOR PATTERNING A SUBSTRATE WITH PHOTORESIST

(75) Inventors: Randy D. Redd; Lawrence S. Klingbeil, both of Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/439,177

(22) Filed: Nov. 12, 1999

(51) Int. Cl.⁷ ........................ H01L 21/31; H01L 21/469
(52) U.S. Cl. ........................ 438/782; 438/780; 427/240
(58) Field of Search ............................ 438/759, 778, 438/780, 782; 427/240

(56) References Cited

U.S. PATENT DOCUMENTS

| | | | |
|---|---|---|---|
| 4,748,053 A | 5/1988 | Okada | 427/240 |
| 5,066,616 A | 11/1991 | Gordon | 437/229 |
| 5,395,803 A | 3/1995 | Adams | 437/229 |
| 5,405,813 A | 4/1995 | Rodrigues | 437/231 |
| 5,677,001 A * | 10/1997 | Wang et al. | 427/240 |
| 5,773,083 A | 6/1998 | Fischer et al. | 427/240 |
| 6,001,417 A * | 12/1999 | Nunotani et al. | 427/154 |
| 6,159,662 A * | 12/2000 | Chen et al. | 430/313 |
| 6,165,552 A * | 12/2000 | Anai et al. | 118/52 |
| 6,284,676 B1 * | 9/2001 | Whitman | 427/240 |

* cited by examiner

Primary Examiner—Carl Whitehead, Jr.
Assistant Examiner—Jamie L. Brophy
(74) Attorney, Agent, or Firm—Mark J. Fink

(57) ABSTRACT

A method for patterning a substrate having a surface with high aspect ratio topography with a photoresist is described. Specifically the surface of a semiconductor substrate is pre-wetted with a solvent solution to form a liquid solvent film. An additional amount of the solvent solution is added to form a solvent puddle on the liquid solvent film. Photoresist is dispensed onto the solvent puddle for a sufficient time and in a sufficient amount to allow diffusion of the photoresist and the solvent puddle into the openings defined in the topography of the substrate. The solvent solution in and on the surface of the openings defined in the substrate from the pre-wetting step is replaced with the photoresist by facilitating diffusion of the photoresist into the topography openings. A photoresist layer is then cast in a predetermined thickness on the surface of the substrate.

15 Claims, 2 Drawing Sheets

- *PRIOR ART* -

METHOD FOR PATTERNING A SUBSTRATE WITH PHOTORESIST

FIELD OF THE INVENTION

The present invention relates, in general, to a process for fabricating integrated circuits, and more particularly, to a method of applying photoresist to a wafer having a surface with high aspect ratio topography to provide more reliable devices.

BACKGROUND OF THE INVENTION

Conventionally, electronic components are manufactured using processes that include steps in which a substrate is coated with coating solutions such as cleaning solvents, adhesion promoters, photoresist, etc. In the manufacture of semiconductor devices, a semiconductor wafer is secured to a turntable and the coating solution is generally dispensed onto a central portion of the semiconductor wafer. Then, the turntable is operated to distribute or spread the coating solution over the semiconductor wafer surface.

Integrated circuit fabrication uses one or more photolithographic steps to define patterns on the surface of a substrate based on an III–IV material, such as a gallium arsenide, or a silicon substrate. Such substrate surfaces are frequently configured to form openings, such as vias, through substrates, cavities, contacts, trenches, etc. that are collectively referred to as high aspect ratio topography. Each opening is defined by describing a width of the opening compared to a depth of the opening.

One technique used in the prior art to control photoresist coating is to flood the wafer surface with photoresist, using two or more times the required amount of photoresist. This method not only is wasteful of photoresist but is also susceptible to problems such as filter clogging that affect accurate metering of volumes of the photoresist. Additionally the photoresist stands on the wafer surface for an extended period of time before spinning off the excess. This approach can result in an uneven distribution of the photoresist layer and interfering with close contact between the mask and the photoresist surface.

Figure 1:
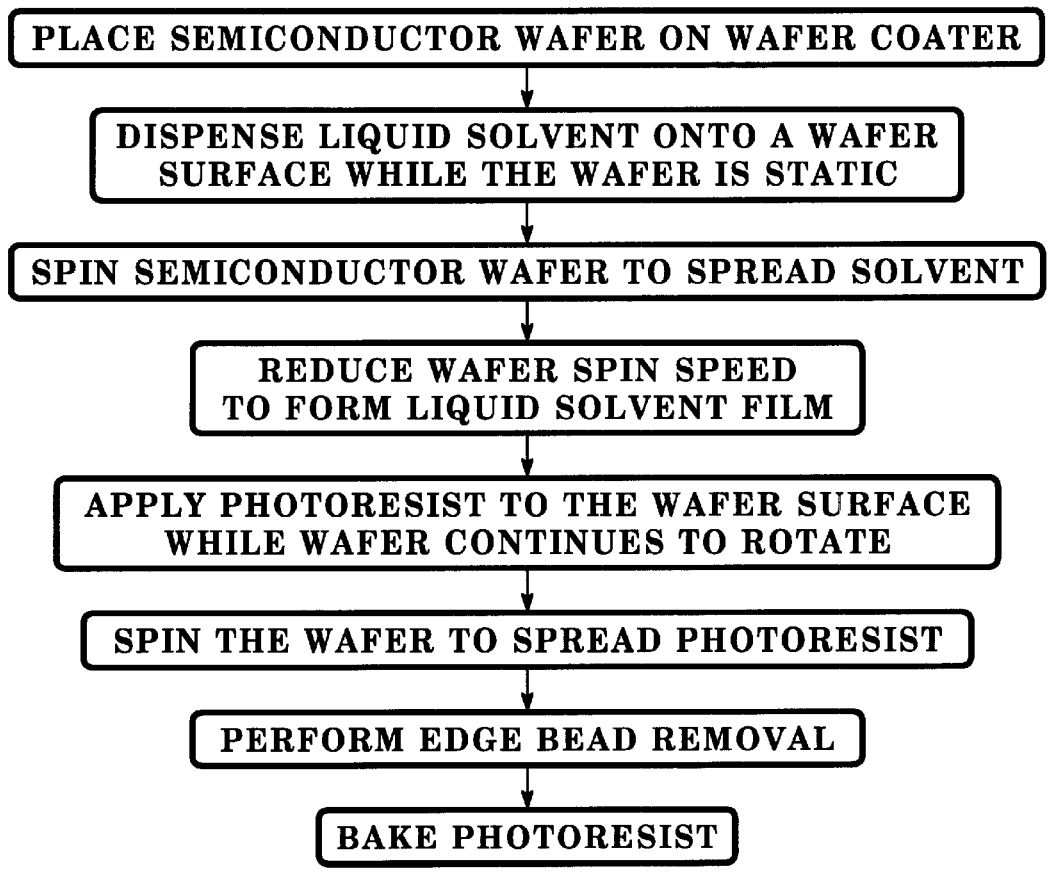

Another technique for coating a semiconductor substrate with photoresist includes pre-wetting the surface of the semiconductor wafer with a solvent and then dispensing the photoresist using spin coating methods as described in U.S. Pat. No. 5,066,616 (Gordon et. al.). This technique involves applying solvent solution while the wafer is static, spinning the wafer to spread the solvent at a high speed for a predetermined time interval, and subsequently reducing the spin speed for a second time interval to form a liquid solvent film. While the wafer is spinning, photoresist is applied to spread the photoresist and form a photoresist coating as illustrated in the flow chart boxes of FIG. 1.

When this technique is used to coat substrate surfaces having high aspect ratio topography, air pockets are formed in the surface configuration that result in rupturing the photoresist. Ultimately the liner metals that are used to line the openings for soldering the wafers to form devices, are etched because of the photoresist ruptures. Without the defect free photoresist lining, liner metal integrity is compromised allowing solder to wick into the configured openings and cause die fractures, a problem that is particularly acute when gallium containing substrates are used.

Therefore, there is a need to provide a method of patterning photoresist onto a substrate that has high aspect ratio topography to prevent photoresist rupture and to provide more reliable semiconductor devices.

SUMMARY OF THE INVENTION

It is therefore an object of the invention to provide a more reliable semiconductor device fabricated with an improved method of applying photoresist to the surface of a wafer with high aspect ratio topography.

The method of the invention includes pre-wetting a surface of the semiconductor substrate that has high aspect ratio topography with a solvent solution to form a liquid solvent film having a thickness of no more than about 500 microns. An additional amount of the solvent solution is puddled onto the liquid solvent film and photoresist is dispensed onto the solvent puddle while the wafer is static or held at a low spin speed for a sufficient time and in a sufficient amount to allow diffusion of the photoresist/solvent puddle into the topography of the substrate. Solvent solution from the pre-wetting step that is on the top surface of the wafer or that has entered the spaces formed in the substrate is then replaced with photoresist by a diffusion process so that the topography of the wafer's surface is lined with photoresist. The photoresist is than cast to a predetermined thickness on the surface of the substrate by a spin method technique. The edges of the coated wafer are cleaned to remove excess photoresist and the wafers are baked to cure the material.

In a preferred embodiment, the liquid solvent film is about 0.1 millimeter to about 3 millimeters thick. The photoresist is applied to the liquid solvent film and allowed to diffuse through the solvent. The fabrication process steps involving prewetting the wafer with the solvent solution and spreading the photoresist itself are preferably accomplished using spin method techniques. Replacing the solvent solution in and on the top of the configured openings in the substrate with photoresist is preferably accomplished by using a low spin speed technique followed by a diffusion step in which the photoresist diffuses into the openings to line the openings and substantially replace the solvent solution. Photoresist diffusion takes place while the wafer is held in a static position or spun at a low spin speed. Diffusion of the photoresist into the configured openings is dependent on the relative viscosities of the photoresist and the solvent solution, the process temperature and time interval the wafer is maintained in a static position or low spin speed during the process. The spin speed of the spin method technique used in conjunction with diffusion to replace the solvent in the openings with photoresist is slower than a spin speed used to cast the photoresist to a predetermined thickness on the wafer surface.

The solvent solution and the photoresist are miscible liquids and the solvent solution includes a glycol monoethyl ether acetate solvent.

DESCRIPTION OF PREFERRED EMBODIMENTS

Although the invention is applicable to the fabrication of any conventional wafer-based substrate material typically used in the art, such as silicon and the III–IV materials, it is particularly useful in manufacturing wafers based on gallium arsenide substrates and particularly gallium arsenide based wafers which are soldered rather than epoxy adhered. The unique problems of fabricating these wafers are handily addressed in the described method.

Figure 2:
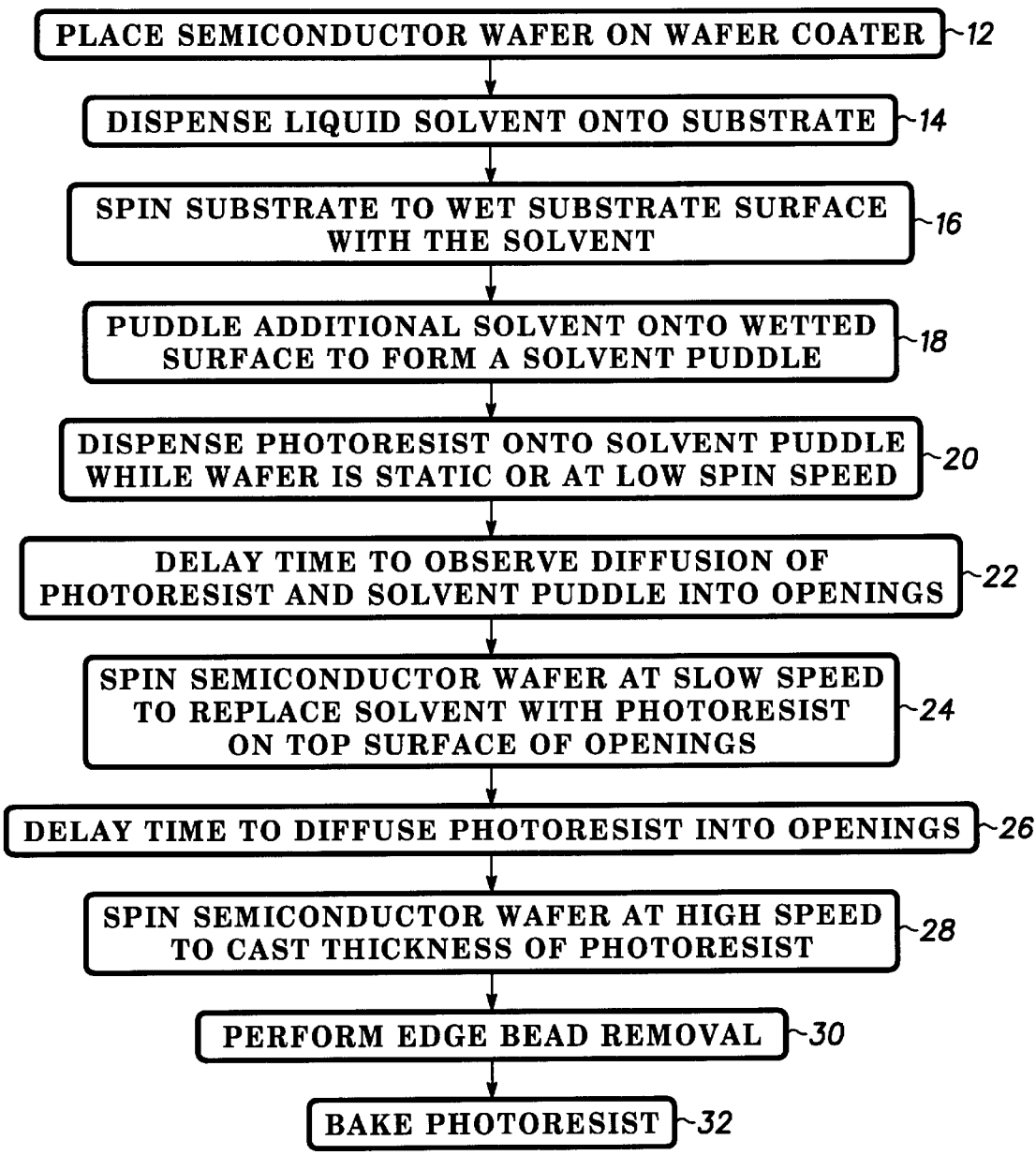

FIG. 2 is a flow chart 10 of a method for patterning photoresist material onto a substrate surface having high aspect ratio topography in accordance with the present method. The high aspect ratio topography is patterned onto a substrate surface in a prior processing step, for example, a layer of nitride is used to form electronic circuits as is conventionally known in the art.

In a first step 12, a semiconductor wafer with high aspect ratio topography on a substrate surface is placed on a turntable in a solvent and photoresist dispenser apparatus. It should be noted that since semiconductor wafers and wafer coating apparatus are well known in the art, they are not shown in FIG. 2.

A quantity of liquid solvent is applied onto a top surface of the wafer and spun off in a prewetting step. Spinoff leaves a thin residual film of solvent on the exposed surfaces of the substrate and across the top or inside the configured openings. The surface thickness of the liquid solvent film is sufficient to display interference colors under visible light or less than about one (1) micron thick. Preferably, the film thickness is about 0.1 to about 3 millimeters thick.

The liquid solvent composition is a glycol monoethyl ether acetate, such as ethylene glycol monoethyl ether acetate, also known as cellusolve acetate or EGMEA ($CH_3COOCH_2CH_2OC_2H_5$) or polyglycol monoethyl ether acetate or PGMEA.

The turntable having the semiconductor wafer mounted thereto is spun at a high speed and a small volume of liquid solvent is dispensed or discharged onto the surface of the semiconductor substrate (indicated by box 14). The high speed spin is sufficient to overcome the surface tension between the solvent and the semiconductor wafer, thereby pre-wetting the surface. By way of example, the semiconductor wafer is a 150 millimeter (6 inch) GaAs wafer, the high speed ranges between approximately 500 and 7,000 r.p.m., and the solvent has a viscosity ranging between approximately 1 and 80 centipoise (cps) and a volume of less than approximately 16 cubic centimeters. Preferably, the high speed spin is 1,000 r.p.m., the viscosity of the solvent is 1 centipoise, and the volume of the solvent is less than approximately 16 cubic centimeters and is preferably 10 cubic centimeters. It should be understood that the order of dispensing and distributing the solvent is not a limitation of the present invention. In other words, the solvent may be dispensed prior to spinning the turntable at its spin speed.

After less than approximately five seconds, the spin speed of the turntable having the semiconductor wafer mounted thereto is lowered to a static or low spin speed and an additional volume of solvent is dispensed onto the pre-wetted surface of the semiconductor substrate to form a solvent puddle (indicated by box 18). In accordance with the example of the semiconductor wafer being a 150 millimeter wafer, the spin speed is approximately 100 r.p.m. and the additional volume of solvent is less than approximately 85 cubic centimeters and is preferably 16 cubic centimeters. Thus, substantially equal amounts of solvent are dispensed in both dispense steps. In accordance with this embodiment, at most a total volume of 26 cubic centimeters of solvent is used.

After the semiconductor wafer has been coated with liquid solvent, photoresist is dispensed onto the solvent puddle, preferably in an amount less than the volume of solvent puddled in the prior step. The photoresist composition may be any conventional material used in the art, preferably the AZ Series photoresist manufactured by Clariant, Inc. of N.J. Referring again to the example of the semiconductor wafer being a 150 millimeter wafer, the spin speed is less than approximately 500 r.p.m. and the volume of photoresist is less than approximately 16 cubic centimeters and is preferably 6 cubic centimeters.

The photoresist is dispensed onto the solvent puddle while the wafer is in a static or low spin speed position indicated by box 20. The turntable is held at the determined spin speed for a time interval sufficient to allow the photoresist/solvent puddle to diffuse into the high aspect ratio topography of the substrate as indicated by box 22. The diffusion time interval is determined by the viscosities of the photoresist and solvent respectively and the temperature at which the process is accomplished. Referring again to the example of the 150 millimeter wafer, the preferred ratio of viscosities of the solvent to the photoresist is 1:10 to 1:400, more preferably 1:10 to 1:100.

At the end of the predetermined time interval, preferably less than about 1 to about 30 seconds, more preferably about 5 seconds, the wafer turntable is spun at a slow speed or is held static to displace any solvent solution from the top surface of the configured openings and in the openings themselves and replace the solvent with photoresist as indicated by box 24. By way of example, when the semiconductor wafer is a 150 millimeter (6 inch) GaAs wafer, the low spin speed ranges between approximately about 1 and 500 r.p.m., preferably, the low speed spin is 300 r.p.m. Importantly, when the wafer is held in a static or low spin speed for a predetermined time interval to permit substantial diffusion of the photoresist into the configured openings to completely line the openings as indicated in box 26.

At the end of the low spin speed, the semiconductor wafer is again spun but at a high spin speed to cast the thickness of the photoresist on the surface of the wafer as indicated in box 28. Referring again to the example of the semiconductor wafer being a 150 millimeter wafer, the spin speed is approximately 2,000 to 7,000 r.p.m., preferably about 4,000 r.p.m. and the volume of photoresist is less than approximately 16 cubic centimeters and is preferably 6 cubic centimeters.

The wafer then undergoes a conventional edge bead removal process (indicated by box 30). The wafer is removed from the turntable and transferred to an oven for baking the photoresist layer in the conventional manner (indicated by box 32). Subsequently, the semiconductor wafer undergoes photolithographic processing.

Although the spin speeds and photoresist viscosities and volumes described hereinbefore have been optimized for 150 millimeter wafers, the method can be adapted for wafers having other sizes, e.g., 100 millimeter (4 inch), 200 millimeter (8 inch), etc., without undue experimentation. In addition, the present invention is not limited to dispensing the solvent or the photoresist over the center of the wafer. In other words, the solvent and the photoresist dispenser may be nonstationary such that it traverses the surface of the wafer while dispensing the solvent and the photoresist. For example, the solvent/photoresist dispenser can dispense the solvent and the photoresist across the wafer starting at the center of the wafer and extending radially to a desired non-central portion of the surface.

By now it should be appreciated that a method for coating a substrate such as a semiconductor wafer with a patterning solution such as photoresist has been provided. While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the patterning solution may include positive and negative photoresists. Similarly, the substrate may include semiconductor substrates such as silicon, gallium or III–IV germanium, or the like. Other suitable substrates include ceramics, plastics, flat panels, or the like.

EXAMPLE

Following is an implementation of the invention for applying photoresist on a top surface of a semiconductor wafer having a high aspect ratio topography. With little or no change, it can be applied to any level in any fabrication process on silicon or other suitable substrate materials. This implementation is preferably computer-controlled for consistency, but has been successfully executed manually.

1. Position wafer on-axis in chuck (turntable). Conventional solvent and photoresist dispensers are positioned centrally over the chuck.
2. Turn on liquid solvent dispenser to discharge solvent (EGMEA; viscosity: 0.5–5.0 centipoise).
3. Wait 2 seconds, then turn off solvent, discharging about 16 milliliters of solvent onto wafer top surface.
4. Wait 5 seconds.
5. Spin wafer at 1000 r.p.m. for 2.6 seconds, which spins off the majority of the solvent.
6. Slow the chuck to 500 r.p.m. and wait 1 second. At this stage, the solvent film thickness shows interference colors consistent with a thickness in the range of 1,000 to 5,000 Angstroms.
7. Puddle additional solvent on the wafer at a static or low spin speed.
8. Turn on photoresist dispenser to discharge liquid photoresist (AZ Series photoresist obtained from Clariant Co. in N.J.) onto wafer atop the liquid solvent film.
9. Wait 5 seconds while in a static position.
10. Spin wafer at 300 r.p.m. for 5 seconds to spread the photoresist and replace the solvent.
11. Spin wafer at 4400 r.p.m. for 30 seconds.
12. Turn off chuck. This leaves a photoresist layer of about 14,000 Angstroms thickness.
13. The wafer is released from the chuck and transferred to an oven for baking the photoresist layer in conventional manner.
14. Clean the wafer with a bead removal process.

Having illustrated and described the principles of the invention in a preferred embodiment, it should be apparent to those skilled in the art that the invention may be modified in arrangement and detail without departing from such principles. We claim all modifications and variations coming within the scope and spirit of the following claims.

We claim:

1. A method for patterning a wafer substrate having a surface with high aspect ratio topography with a coating solution, comprising the steps of:
    pre-wetting a surface of a wafer substrate having high aspect ratio topography with a solvent solution to form a liquid solvent film;
    applying an additional amount of the solvent solution to form a solvent puddle on the liquid solvent film;
    dispensing photoresist onto the solvent puddle for a sufficient time and in a sufficient amount to allow diffusion of the photoresist and the solvent puddle into the topography of the surface of the substrate;
    replacing the solvent solution in the topography from the pre-wetting step with the photoresist by facilitating diffusion of the photoresist into the topography; and
    spreading the photoresist to cast a predetermined thickness of the photoresist on the surface of the substrate.
2. The method of claim 1, wherein the topography comprises openings selected from the group consisting of vias, cavities, trenches and mixtures thereof.
3. The method of claim 1, wherein the steps of pre-wetting, replacing and spreading comprise: spinning the substrate using the spin coating technique.
4. The method of claim 3, wherein the replacing step further comprises: holding the substrate for a predetermined time period after using the spin coating technique to allow the diffusing of the photoresist into the topography.
5. The method of claim 3, wherein using the spin coating technique comprises using a spin speed to replace the solvent solution in the openings of the topography with the photoresist that is slower than a spin speed for spreading the photoresist.
6. The method of claim 5, wherein the spin speed for replacing the solvent solution in openings of the topography with the photoresist is between approximately 1 and 500 revolutions per minute and the spin speed for spreading the photoresist is between approximately 2,000 and approximately 7,000 revolutions per minute.
7. The method of claim 1, wherein the solvent solution and the photoresist are miscible.
8. The method of claim 7 wherein the solvent solution comprises a glycol monoethyl ether acetate solvent.
9. The method of claim 1 wherein the solvent film has a thickness in a range of about 0.1 to about 3 millimeters.
10. A method for applying photoresist to a surface of a semiconductor wafer having high aspect ratio topography for defining an electronic circuit pattern thereto, the method comprising the steps of:
    positioning a semiconductor wafer having a surface with high aspect ratio topography on a wafer turntable with a top surface of the wafer facing upward;
    pre-wetting the top surface of the wafer with a solvent solution to form a liquid solvent film;
    applying an additional amount of the solvent solution to form a solvent puddle on the solvent film;
    dispensing photoresist onto the solvent puddle for a sufficient time and in a sufficient amount to allow diffusion of the photoresist and the solvent puddle into openings defined by the high aspect ratio topography of the wafer;
    spinning the wafer at a first spin speed to replace the liquid solvent solution in the openings from the pre-wetting step with the photoresist;
    holding the wafer in a static position or at low spin speed to further diffuse the photoresist into the high aspect ratio topography; and
    spinning the wafer at a second spin speed greater that the first spin speed for replacing the liquid solvent solution in the openings to cast a predetermined thickness of the photoresist on the top surface of the wafer.
11. The method of claim 10, wherein the openings defined in the topography are vias, cavities, trenches, and mixtures thereof.
12. The method of claim 10 wherein the first spin speed is between approximately 1 and 500 revolutions per minute and the second spin speed for spreading the photoresist is between approximately 2,000 and approximately 7,000 revolutions per minute.
13. The method of claim 10, wherein the solvent solution and the photoresist are miscible.
14. The method of claim 13 wherein the solvent solution comprises a glycol monoethyl ether acetate solvent.
15. The method of claim 10 wherein the liquid solvent film has a thickness in a range of about 0.1 to about 3 millimeters.

* * * * *